(12) United States Patent
Schmid et al.

(10) Patent No.: US 7,795,888 B2
(45) Date of Patent: Sep. 14, 2010

(54) CONTACT DEVICE TO CONTACT AN ELECTRICAL TEST SPECIMEN TO BE TESTED AND A CORRESPONDING CONTACT PROCESS

(75) Inventors: Rainer Schmid, Pliezhausen (DE); Ulrich Gauss, Herrenberg (DE)

(73) Assignee: Feinmetall GmbH, Herrenberg (DE)

( * ) Notice: Subject to any disclaimer, the term of this patent is extended or adjusted under 35 U.S.C. 154(b) by 61 days.

(21) Appl. No.: 11/986,852

(22) Filed: Nov. 27, 2007

(65) Prior Publication Data
US 2008/0150564 A1    Jun. 26, 2008

(30) Foreign Application Priority Data
Nov. 27, 2006  (DE) ........................ 10 2006 056 243
Nov. 14, 2007  (DE) ........................ 10 2007 054 187

(51) Int. Cl.
*G01R 31/02*  (2006.01)
(52) U.S. Cl. ........................ 324/754; 324/761
(58) Field of Classification Search ................ None
See application file for complete search history.

(56) References Cited

U.S. PATENT DOCUMENTS

| | | | | |
|---|---|---|---|---|
| 4,901,013 A * | 2/1990 | Benedetto et al. | ............ | 324/761 |
| 5,175,496 A * | 12/1992 | Collins et al. | ................ | 324/754 |
| 5,525,911 A * | 6/1996 | Marumo et al. | .............. | 324/754 |
| 6,674,627 B1 * | 1/2004 | Kund | .......................... | 361/143 |
| 6,998,858 B2 * | 2/2006 | Sawada et al. | .............. | 324/754 |
| 7,400,156 B2 * | 7/2008 | Wu et al. | ..................... | 324/754 |
| 2005/0253608 A1 | 11/2005 | Bohm | | |
| 2005/0264312 A1 | 12/2005 | Bohm et al. | | |

FOREIGN PATENT DOCUMENTS

| | | |
|---|---|---|
| JP | H02-051010 A | 4/1990 |
| JP | H11-038044 A | 2/1999 |
| JP | 3061575 B | 6/1999 |
| JP | 2000-240149 A | 9/2000 |
| JP | 2001-189354 A | 7/2001 |
| JP | 2003-167296 A | 6/2003 |
| JP | 2008-070266 A | 3/2008 |

OTHER PUBLICATIONS

Chinese First Office Action for Application No. CN 2007 10159823.9, issued Aug. 21, 2009, 6 Pages.
First Office Action for Application No. CN 2007 10162079.8 in parallel Chinese procedure, issued Mar. 18, 2010, (5 pages), with English translation (3 pages).
Japanese Office Action for parallel application JP2007-304365, mailed May 25, 2010.

* cited by examiner

*Primary Examiner*—Paresh Patel
(74) *Attorney, Agent, or Firm*—Harness, Dickey & Pierce, P.L.C.

(57) ABSTRACT

The invention relates to a contacting device for contacting an electrical test piece to be tested, in particular a test piece provided with tin-plated contacts, comprising at least two guide elements having openings through which contact elements pass essentially axially and which project from the test piece, on a side of the associated guide element facing the test piece, for contacting the test piece. The invention is characterized in that the axial distance between the guide elements or the axial position of the guide element facing the test piece may be adjusted to fit the projecting length.

13 Claims, 3 Drawing Sheets

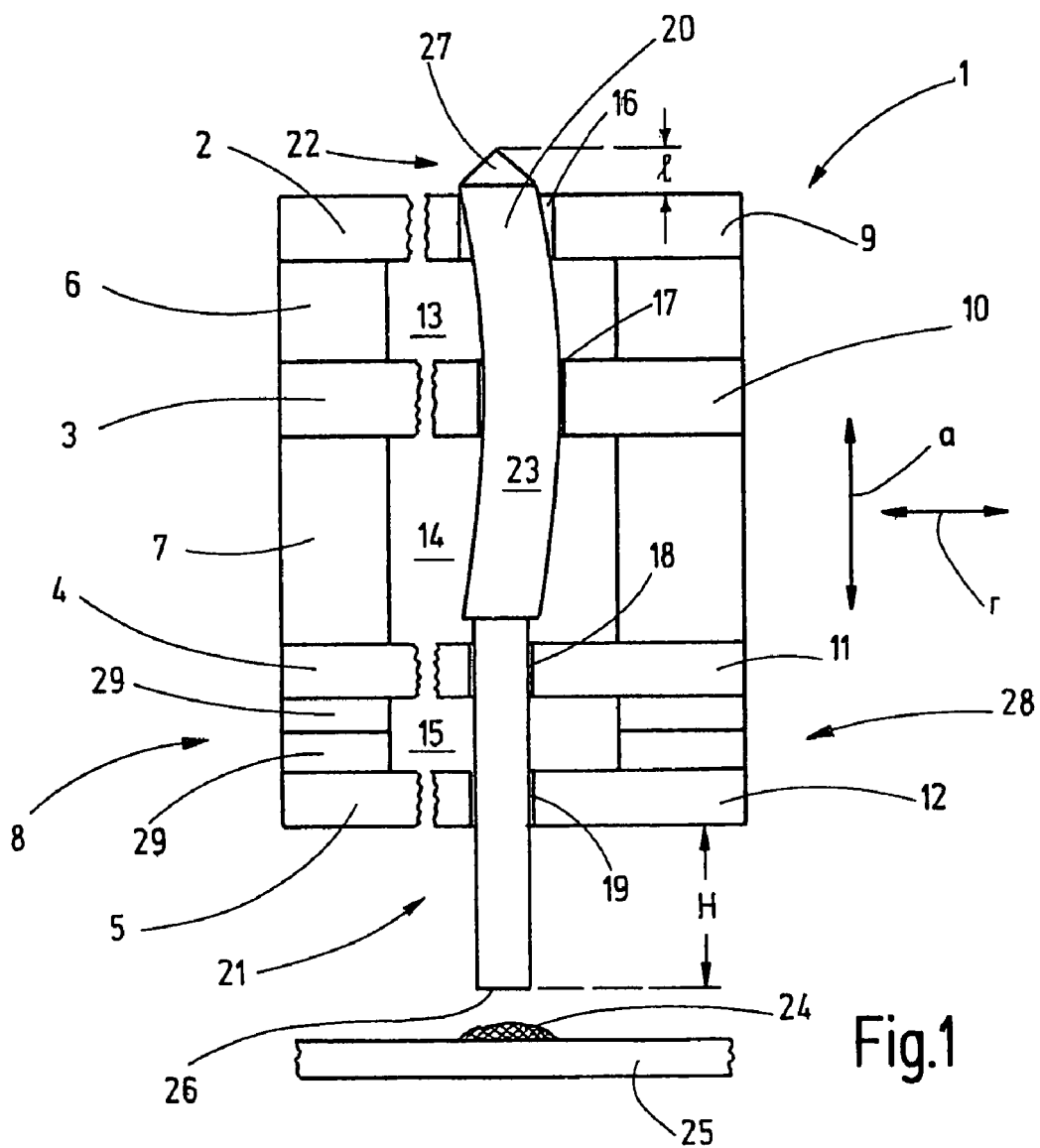
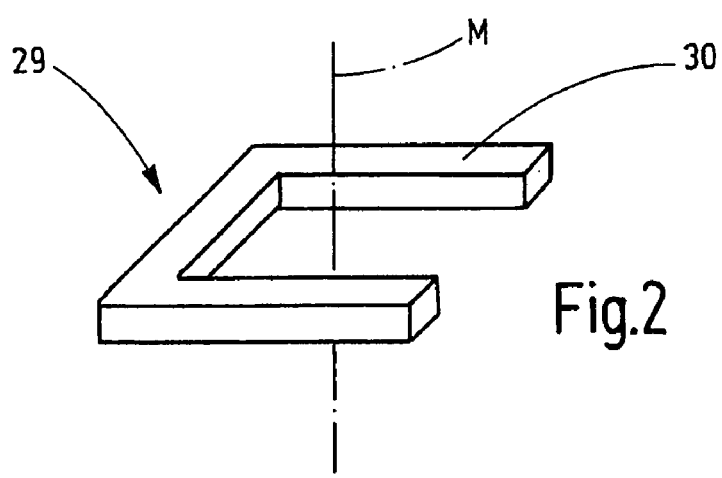

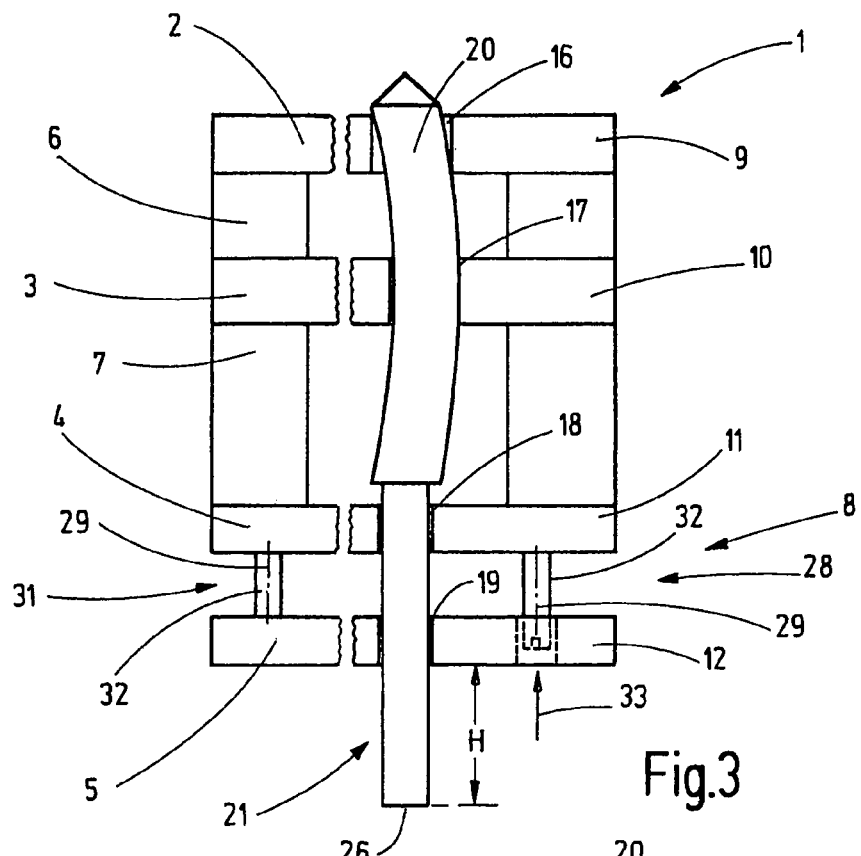
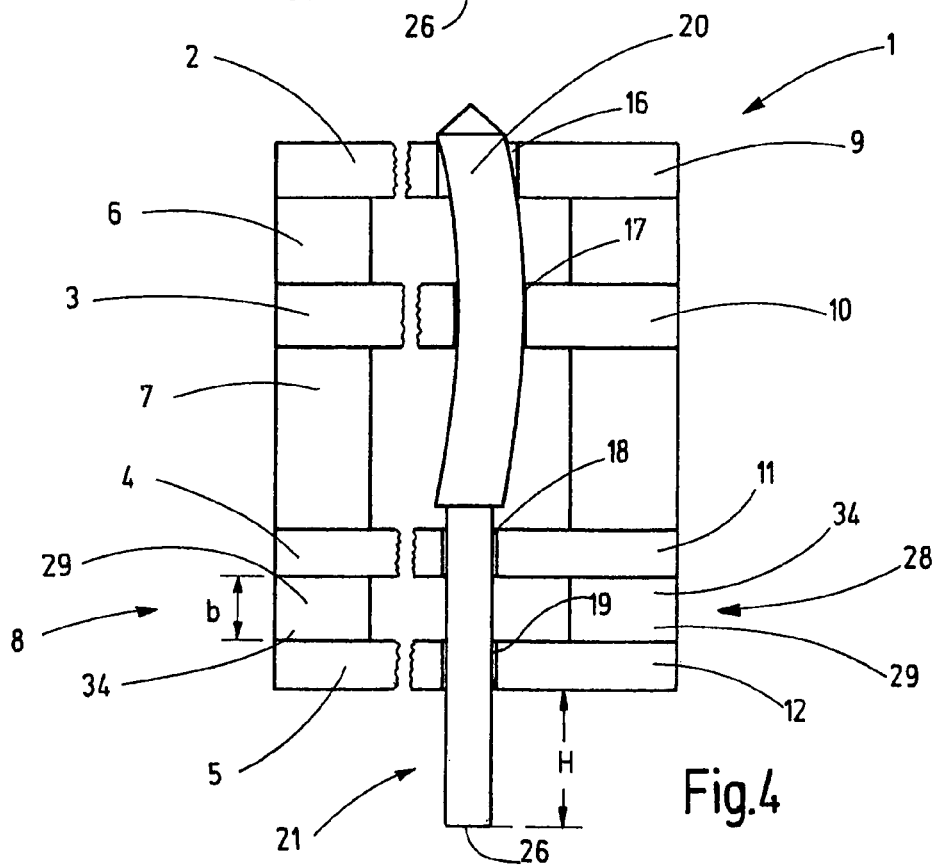

CONTACT DEVICE TO CONTACT AN ELECTRICAL TEST SPECIMEN TO BE TESTED AND A CORRESPONDING CONTACT PROCESS

CROSS-REFERENCE TO RELATED APPLICATIONS

This application claims the benefit of DE 10 2006 056 243.7, filed Nov. 27, 2006 and DE 10 2007 054 187.4, filed Nov. 14, 2007. The disclosures of the above applications are incorporated herein by reference.

FIELD

The invention relates to a contacting device for contacting an electrical test piece to be tested, in particular a test piece provided with tin-plated contacts, comprising at least two guide elements having openings through which contact elements pass essentially axially and which project from the test piece, on a side of the associated guide element facing the test piece, with a projecting length for contacting the test piece.

BACKGROUND

The statements in this section merely provide background information related to the present disclosure and may not constitute prior art.

A contacting device of the aforementioned type is known. Pin-shaped contact elements are positioned and held by being supported in openings in guide elements spaced at an axial distance from one another. The guide elements are designed as guide plates. The openings are preferably designed as boreholes, whereby guide lengths and borehole positions are fixed parameters. The pin-shaped contacts are also referred to as needles, one end of which is used to contact test points of the test piece, and the other end of which cooperates with a contacting device which is connected to an electrical test device. In this manner testing circuits may be connected in order to test the function, in particular the electrical function, of the test piece. In one specialized design the ends of the needle which contact the test piece may be provided without tips, i.e., so as to extend flatly, when in particular solder points of the test piece are to be contacted. The ends of the needles become soiled when the test piece is frequently contacted. The soilage is occasionally removed, preferably by abrasion, i.e., ground off, as the result of which a fraction of the length of the needles is always ground off as well. This relatively severe wear on the needles results in a corresponding shortening of the needles, requiring replacement of the needles when a minimum length is reached.

SUMMARY

The object of the invention is to significantly increase the service life of contact elements, in particular needles, in contacting devices.

This object is achieved according to the invention by the fact that the axial distance between the guide elements or the axial position of the guide element facing the test piece may be adjusted to fit the projecting length. As a result of these possibilities for axially displacing the guide elements relative to one another, or axially displacing the guide element facing the test piece, the needles after wearing down may once again acquire a sufficiently large projection to ensure good contacting. It is irrelevant whether the needles have a contact tip or have a flat-ground design. However, the flat design has the advantage that in the abrasive treatment performed to clean the needle tips the shape of the needle ends is preserved. When pointed needles are present, grinding also results in shortening of the tips. A further advantage of the subject matter of the invention is that the projection, i.e., the projecting length, of the needle ends may be kept relatively short, since according to the invention possibilities for adjustment exist, the short guide ensuring satisfactory guiding, which in turn provides good positioning and thus good contacting.

Further areas of applicability will become apparent from the description provided herein. It should be understood that the description and specific examples are intended for purposes of illustration only and are not intended to limit the scope of the present disclosure.

According to one refinement of the invention, the axial distance between the guide elements may be adjusted by means of at least one adjustment device. The adjustment device provides axial displacement of the guide element with the objective of adjusting or readjusting the projecting length of the contact elements.

The adjustment device may preferably be a continuous adjustment device and/or a stepped adjustment device. The continuous adjustment device allows stepless adjustment, whereas the stepped adjustment device allows the associated guide element to be displaced in specified increments.

Continuous adjustment is provided in particular when the adjustment device is preferentially designed as a threaded adjustment device. When at least one threaded system rotates the referenced adjustment device, the associated guide element is correspondingly displaced in the axial direction in a continuous manner.

It is advantageous when the adjustment device is a pneumatic, hydraulic, and/or piezoelectric adjustment device. Accordingly, the axial distance between the guide elements may be adjusted by means of the pneumatic adjustment device, i.e., by air pressure. Alternatively, a hydraulic adjustment device is possible in which the referenced adjustment takes place using a hydraulic medium. Since the adjustment paths are relatively small, the adjustment device may also be a piezoelectric adjustment device. Such a device changes the length of a piezoelectric path by impinging the path with a greater or smaller electrical voltage. By adjusting the electrical voltage, mechanical displacement may be achieved which in turn results in displacement of the associated guide element.

According to one refinement of the invention, the adjustment device is a wedged and/or stepped device which preferably is essentially radially displaceable. The guide element associated with the end regions of the contact elements is preferably supported on an additional axially spaced guide element. This support of the two guide elements is preferably provided by the adjustment device. If this adjustment device is adjustable in length, in particular in the form of a wedged and/or stepped device, it is obvious that, depending on the size of the wedge and/or the width of the step, the distance between the two guide elements may be adjusted, thus allowing the projecting length of the contact elements to be correspondingly adjusted. For a wedged device this is performed continuously, and for a stepped device, discontinuously, i.e., in steps.

One refinement of the invention provides that the adjustment device is designed as a removal device, and as a result of the removal the axial distance between the guide elements is decreased. As previously mentioned, the adjustment device is situated between the two guide elements. When these guide elements can be removed, the distance between the guide elements is reduced, and the guide elements meet one another when the only adjustment device that is situated therebetween is then removed. Of course, multiple adjustment devices which are all designed as removal devices may also be provided in a row in the axial direction, or the adjustment device may have multiple removable elements. When one of the removal devices or one of the elements is removed, the axial distance between the guide elements is decreased by a corresponding unit, resulting in a corresponding increase in the projecting length of the contact elements. The removal of another removal device or another element when the length of the contact element has been further reduced by wear in turn results in the possibility for correcting the projecting length. This procedure may be repeated often, and depends on the number of removal devices or elements situated in a row.

From the discussion above it is apparent that the axial distance between the guide elements may be adjusted by means of at least one element or the like provided between the guide elements. Since the guide elements are supported on this element, the element constitutes a spacer. If the spacer is preferentially changeable in thickness, it is possible according to the invention to adjust the projecting length of the contact elements. For the adjustment device under discussion it is possible, as previously mentioned, to provide the adjustment device between the guide elements. Alternatively, however, the adjustment device may be associated with another component of the contacting device and still change the axial position of the guide element associated with the ends of the test contacts in order to adjust the projecting length. For the at least one spacer under discussion, this spacer is situated between the at least two guide elements; i.e., the guide elements are directly or indirectly supported on the spacer. The thickness of the spacer may preferably be changed. To this end, once again an adjustment device and/or threaded adjustment device and/or pneumatic, hydraulic, and/or piezoelectric adjustment device and/or wedged device and/or stepped device and/or removal device may be provided.

According to one refinement of the invention, the axial distance may be adjusted by means of at least one removable and/or essentially radially displaceable spacer. The removable spacer may in particular have a frame-like design or be composed of frame parts. In this regard it is advantageous when the frame-like design is provided as a frame configuration that is open on at least one side. In this manner U-shaped frame parts may be obtained. When in particular multiple such spacers are provided which are stacked one on top of the other and individually removable, depending on the number of spacers removed it is possible to adjust the projecting length, and this procedure may be performed in succession; i.e., after corresponding wear of the contact elements at least one spacer is always removed from the consecutively axially situated spacers.

When the spacers have a frame-like, in particular a U-shaped, design, the spacers are preferably rotationally offset relative to one another about an axial axis; i.e., not all U's are flush with one another, but instead are rotationally offset, for example, by 180° or by 90° relative to one another, resulting in a more secure and better supporting interior space for the structure containing the contact elements.

The invention further relates to a method for contacting an electrical test piece to be tested, in particular a test piece provided with tin-plated contacts, preferably by use of the above-mentioned contacting device, the contacting taking place by means of contact elements which extend essentially axially and pass through at last two guide elements, the contact elements projecting from the test piece, on a side of the associated guide element facing the test piece, for contacting the test piece, and the axial distance between the guide elements or the axial position of the guide element facing the test piece being adjusted/adjustable to fit the projecting length.

DRAWINGS

The drawings described herein are for illustration purposes only and are not intended to limit the scope of the present disclosure in any way.

The invention is illustrated by means of the drawings, with reference to exemplary embodiments, as follows:

FIG. 1 shows a schematic enlarged illustration of a contacting device for contacting an electrical test piece to be tested;

FIG. 2 shows a spacer for the contacting device for adjusting the projecting length of contact elements;

FIG. 3 shows a contacting device according to a further exemplary embodiment;

FIG. 4 shows a contacting device according to a further exemplary embodiment.

DETAILED DESCRIPTION

Figure 5:
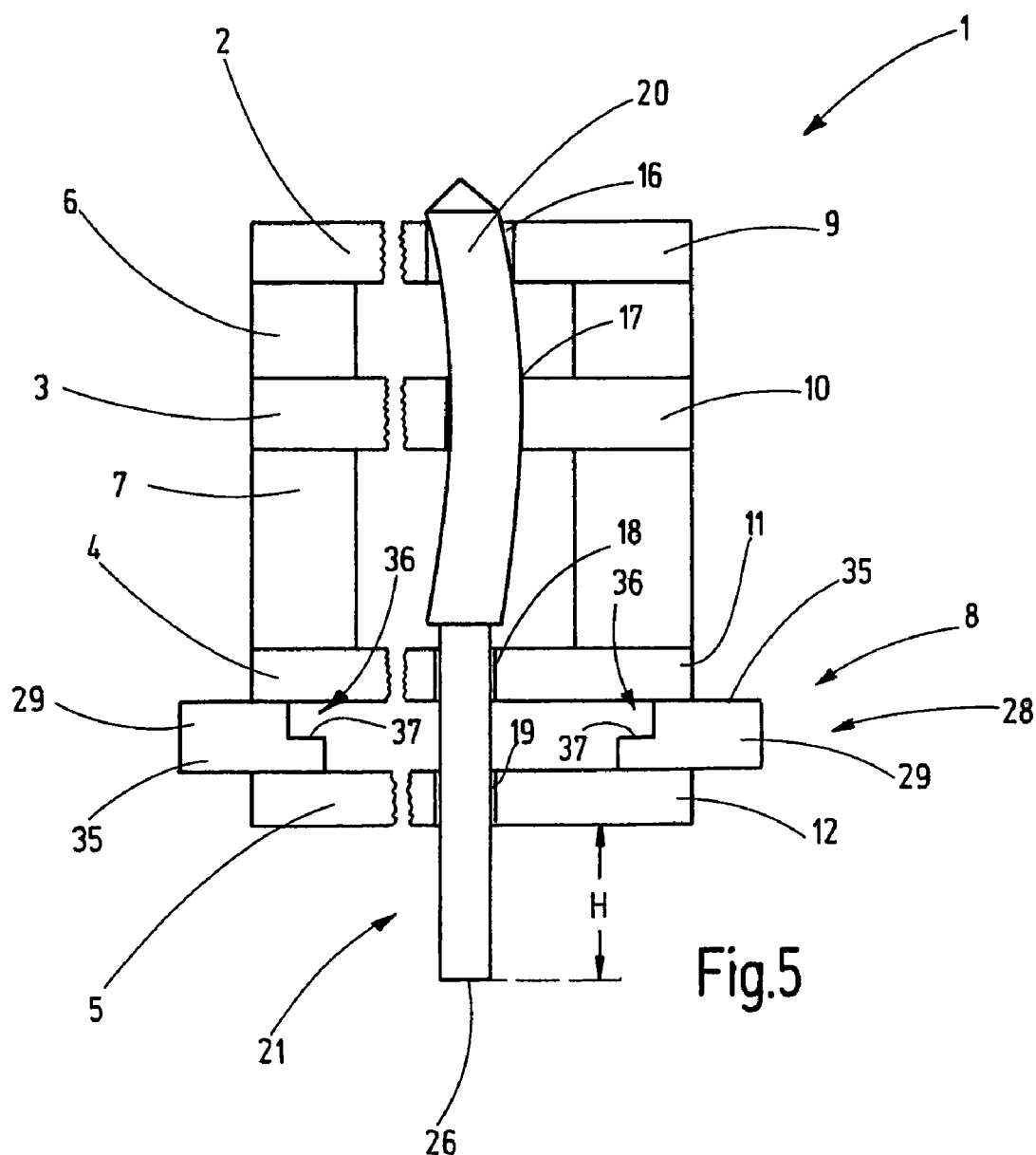
FIG. 5 shows a contacting device according to a further exemplary embodiment.

The following description is merely exemplary in nature and is not intended to limit the present disclosure, application, or uses. It should be understood that throughout the drawings, corresponding reference numerals indicate like or corresponding parts and features.

FIG. 1 shows a contacting device 1 illustrated in enlarged and strictly schematic form. The contacting device has four guide elements 2, 3, 4, and 5, spaced parallel to one another in the axial direction a, between which spacer elements 6, 7, and 8 are provided. In particular, spacer element 6 is positioned between guide elements 2 and 3, spacer element 7 is positioned between guide elements 3 and 4, and spacer element 8 is positioned between guide elements 4 and 5. Guide elements 2, 3, 4, and 5 are designed as guide plates 9, 10, 11, and 12, and spacer elements 6, 7, and 8 have a frame-like design, thus forming cavities 13, 14, and 15 in the interior of the contacting device. The electrically nonconductive guide plates 9 through 12 have a plurality of respective openings 16, 17, 18, and 19, openings 16, 18, and 19 being axially aligned relative to one another and opening 17 being offset with respect to the alignment line in the radial direction r. A contact element 20 is axially inserted into openings 16 through 19 so that one end region 21 of the contact element projects from the opening 19 in the guide plate 12 with a projecting length H. The other end of the contact element 20 projects with an end region 22 from the opening 16 in the guide plate 9 with a length l. The configuration is arranged in such a way that the contact element 20 is provided in places with insulation 23, and in the region of the guide plates 11 and 12 is not provided with insulation. In this latter area the contact element is accordingly made of an uninsulated material with good electrical conductivity. Alternatively, contact elements 20 without insulation may also be used. As a result of the opening 17 being offset relative to the other openings 16, 18, and 19, a bend is imparted to the intrinsically elastic contact element 20 so that it is held in the contacting device in a self-retaining yet axially displaceable manner. Openings 16 through 19 are preferably designed as boreholes which in particular are produced by laser beam. The diameter of the contact element 20 is relatively small, for example having approximately the diameter of a human hair.

FIG. 1 shows that guide plates 9 through 12 are each illustrated in a broken manner; i.e., for simplicity the contacting device 1 is illustrated with only one contact element 20. In reality, a plurality of such contact elements is provided to allow contacting of a corresponding number of test points 24 of an electrical test piece 25 to be tested, each at the respective end face 26 of the contact element 20. For this purpose the test piece 25 is moved toward the end faces 26. The opposite end 27 of the respective contact element 20 meets a countercontact surface (not illustrated) which is connected to an electronic test device. In this manner current paths to the test piece 25 may be generated to test the function thereof.

The contact elements are preferably designed as contact pins, in particular as contact needles. Due to their curvature they are also referred to as elbow needles.

During the testing the end face 26 of the end region 21 contacts the test point 24 of the test piece 25, in the present case the test point 24 being formed by a solder point, i.e., a raised tin head. As the result of numerous contacting operations the end region of the contact element 20 contacting the test piece becomes soiled, and therefore it is abrasively cleaned from time to time. Not only is the soilage removed, but the material of the contact element 20 is always removed as well, with the result that the contact element becomes correspondingly shorter. This reduces the projecting length H, so that after a corresponding number of cleaning operations the control element 20 must be replaced. By use of the invention, however, this is not necessary, since the projecting length H may be adjusted by changing the distance between guide elements 4 and 5 according to the invention. For this purpose, an adjustment device 28 is provided between guide elements 4 and 5, i.e., between guide plates 11 and 12, or, as an alternative design, an adjustment device 28 which is not supported on guide element 4, but instead is attached to another part of the contacting device 1 is associated with guide element 5, so that guide element 5 is axially displaced, or may be axially displaced, relative to guide element 4. In the exemplary embodiment of FIG. 1, the adjustment device 28 is composed of multiple spacers 29 which are axially stacked. According to FIG. 2 each spacer 29 has a frame-like design, i.e., is a U-shaped frame part 30. The scale of FIG. 2 does not match that of FIG. 1, FIG. 2 being reduced in scale compared to FIG. 1. However, it is apparent that the stacking of multiple U-shaped frame parts 30 results in the formation of an adjustment device 28 which is situated between guide plates 11 and 12 and thus specifies the distance between guide plates 11 and 12. The stacking is preferably provided in a rotationally offset manner about a center axis M (FIG. 2); for example, when two U-shaped frame parts are used these are offset relative to one another by 180°. When more than two U-shaped frame parts 30 are provided, these are preferably offset relative to one another in each case by an angle of 90°.

When the end region 21 no longer projects sufficiently from the opening 19 in the guide plate 12 after multiple cleaning operations, a spacer 29, i.e., a U-shaped frame part 30, is removed after prior loosening of the corresponding parts, and the device is then again tightly screwed, pressed, or the like. As a result, the projecting length H corresponding to the thickness of the removed spacer 29 is increased, so that once again a sufficient projecting length H is present. This procedure may be repeated multiple times, depending on the number of spacers 29 used.

FIG. 3 shows an exemplary embodiment corresponding to FIG. 1; reference is therefore made to the above description. The only difference is that in this case, the adjustment device 28 is designed as a threaded adjustment device 31. For this purpose, preferably multiple threaded pins 32 hold guide plates 11 and 12 at an axial distance from one another. When the threaded pins 32 are rotated by inserting an appropriate tool (arrow 33), the distance between guide plates 11 and 12 changes, with the result that the projecting length H may be adjusted. For this purpose the threaded pins 32 must have opposing threads at their end regions. The threaded pins project into corresponding threaded boreholes in guide plates 11 and 12. This is indicated in FIG. 3 for one of the threaded pins 32 in the region of guide plate 12. By use of the threaded adjustment device 31 a continuous adjustment is possible; i.e., a continuously operating adjustment device 28 is present.

FIG. 4 shows a further exemplary embodiment which once again corresponds to the exemplary embodiment of FIG. 1, so that reference is made to the above description. The only difference is the design of the adjustment device 28, which in this case is provided as a piezoelectric adjustment device 34. This adjustment device is situated between guide plates 11 and 12, and may be acted on by a source of electrical voltage (not illustrated), with the result that the length b changes as a function of the voltage level, so that the distance between guide plates 11 and 12 and thus the projecting length H of the contact element 20 may be adjusted.

FIG. 5 shows a further exemplary embodiment of a contacting device 1 which once again corresponds to the exemplary embodiment FIG. 1, the only difference being that in this case the adjustment device 28 is designed as a stepped device 35. Two stepped devices 35 are provided which are used as spacers 29 and which have different thicknesses due to the respective step design 36. In the position of the two stepped devices 35 shown in FIG. 5, use is made of the maximum thickness of these devices in order to keep guide plates 11 and 12 at an appropriate distance from one another. When the projecting length H of the contact element 20 is no longer sufficient, the two stepped devices 35, after prior loosening of appropriate components, may be moved radially outward, with the result that after subsequent assembly the guide plate 11 rests on a step surface 37 of the respective stepped device 35, thereby reducing the distance between guide plates 11 and 12 and accordingly increasing the projecting length H by the corresponding distance.

The thickness of the spacers 29 according to FIG. 1 is preferably 150 μm, and is selected such that removal of a separating layer results in a contact element projection (projecting length H) which is long enough but not excessively long in relation to the diameter of the contact element 20.

What is claimed is:

1. A contacting device for contacting an electrical test piece to be tested, the test piece provided with contacts, the contacting device comprising:
   at least two guide elements having openings through which contact elements pass generally axially and which project from the test piece on a side of the associated guide element facing the test piece for contacting the test piece;
   wherein at least one of an axial distance between the guide elements and an axial position of the guide element facing the test piece may be adjusted to fit the projecting length;
   wherein the axial distance is adjusted by at least one spacer selected from a group including a removable spacer and a generally radially displaceable spacer;
   wherein the removable spacer has a frame-like design or is composed of frame parts;
   wherein the frame-like design is provided as a frame configuration that is open on at least one side.

2. The contacting device according to claim 1, wherein removal of the at least one removable spacer reduces the axial distance between the guide elements.

3. The contacting device according to claim 1, wherein a thickness of the at least one spacer is changeable.

4. The contacting device according to claim 1, wherein the at least one spacer includes a plurality of spacers which are individually removable.

5. The contacting device according to claim 4, wherein the stacked spacers are rotationally offset relative to one another about an axial axis.

6. A method for contacting an electrical test piece to be tested, the method comprising:
- providing a contacting device having at least two guide elements with openings through which contact elements pass generally axially and which project from the test piece on a side of the associated guide element facing the test piece for contacting the test piece;
- positioning at least one removable spacer between the at least two guide elements, the at least one removable spacer having a frame-like design that is open on at least one side; and
- removing a first spacer of the at least one removable spacers to adjust at least one of an axial distance between the guide elements and an axial position of the guide element facing the test piece.

7. The method according to claim 6, wherein positioning includes positioning a plurality of removable spacers.

8. The method according to claim 7, further comprising stacking the plurality of removable spacers.

9. The method according to claim 8, further comprising rotationally offsetting the plurality of removable spacers relative to one another about an axial axis.

10. A contacting device for contacting an electrical test piece to be tested comprising:
- at least two guide elements having openings through which contact elements pass generally axially and which project from the test piece on a side of the associated guide element facing the test piece for contacting the test piece;
- wherein at least one of an axial distance between the guide elements and an axial position of the guide element facing the test piece may be adjusted to fit the projecting length;
- wherein the axial distance is adjusted by at least one spacer selected from a group including a removable spacer and a generally radially displaceable spacer;
- wherein the removable spacer has a frame-like design or is composed of frame parts;
- wherein the frame-like design is formed by U-shaped frame parts.

11. The contacting device according to claim 10, wherein the at least one spacer includes a plurality of spacers.

12. The contacting device according to claim 11, wherein the plurality of spacers are stacked.

13. The contacting device according to claim 12, wherein the plurality of stacked spacers are rotationally offset relative to one another about an axial axis.

* * * * *